United States Patent
Dams et al.

(10) Patent No.: US 7,084,956 B2
(45) Date of Patent: Aug. 1, 2006

(54) SUPPORTING DEVICE, LITHOGRAPHIC APPARATUS, AND DEVICE MANUFACTURING METHOD EMPLOYING A SUPPORTING DEVICE, AND A POSITION CONTROL SYSTEM ARRANGED FOR USE IN A SUPPORTING DEVICE

(75) Inventors: Johannes Adrianus Antonius Theodorus Dams, Veldhoven (NL); Frank Auer, Valkenswaard (NL)

(73) Assignee: ASML Netherlands B.V, Veldhoven (NL)

( * ) Notice: Subject to any disclaimer, the term of this patent is extended or adjusted under 35 U.S.C. 154(b) by 158 days.

(21) Appl. No.: 10/864,806

(22) Filed: Jun. 10, 2004

(65) Prior Publication Data

US 2005/0018160 A1    Jan. 27, 2005

(30) Foreign Application Priority Data

Jun. 13, 2003   (EP) ................................ 03076923
Aug. 11, 2003   (EP) ................................ 03077540

(51) Int. Cl.
G03B 72/42   (2006.01)
G03B 27/58   (2006.01)
G03B 27/32   (2006.01)

(52) U.S. Cl. ........................ 355/53; 355/75; 355/77
(58) Field of Classification Search ................. 355/53, 355/72, 73, 75, 77; 310/10
See application file for complete search history.

(56) References Cited

U.S. PATENT DOCUMENTS 5,844,666 A * 12/1998 Van Engelen et al. ........ 355/72
6,144,442 A * 11/2000 'T Mannetje et al. ........ 355/73
6,788,386 B1 * 9/2004 Cox et al. ...................... 355/53
2001/0026408 A1 * 10/2001 Tanaka ......................... 359/826
2002/0021423 A1 * 2/2002 Korenaga et al. ............ 355/53

FOREIGN PATENT DOCUMENTS

EP    1 321 822 A1 *   6/2003

* cited by examiner

Primary Examiner—Alan Mathews
(74) Attorney, Agent, or Firm—Pillsbury Winthrop Shaw Pittman LLP

(57) ABSTRACT

A supporting device for supporting in a lithographic projection apparatus a supported part relative to a supporting part, is presented. The supporting device includes a first part that engages the supporting part of the lithographic projection apparatus; a second part that engages the supported part of the lithographic projection apparatus; a supporting spring system disposed between the first part and the second part; and a position control system configured to control a position of the supported part. The position control system comprises at least one reference object that is movable relative to the supporting part; a reference support device that supports the reference object relative to the first part, wherein the reference object and the reference support device form a reference mass-spring system; at least one position sensor that detects at least one attribute of the position of the second part relative to at least one of the reference objects, the position sensor including a sensor output for outputting a position signal representing at least one of the attributes; and an actuator, communicatively coupled to the position sensor, that is configured to adjust the position of the second part relative to the first part, in response to the position signal.

11 Claims, 6 Drawing Sheets

SUPPORTING DEVICE, LITHOGRAPHIC APPARATUS, AND DEVICE MANUFACTURING METHOD EMPLOYING A SUPPORTING DEVICE, AND A POSITION CONTROL SYSTEM ARRANGED FOR USE IN A SUPPORTING DEVICE

BACKGROUND OF THE INVENTION

1. Priority Information

This application claims priority from European Patent Application No. 03077540.7, filed Aug. 11, 2003, and European Patent Application No. 03076923.6, filed Jun. 13, 2003, herein incorporated by reference in their entirety.

2. Field of the Invention

The present invention relates to a supporting device, a lithographic apparatus, a device manufacturing method, and a position control system.

3. Description of the Related Art

Lithographic projection apparatuses can be used, for example, in the manufacture of integrated circuits (ICs). In such a case, patterning device of the lithographic projection apparatus may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist).

In general, a single wafer will contain a whole network of adjacent target portions that are successively irradiated via the projection system, one at a time. More information with regard to lithographic projection apparatuses as here described can be gleaned, for example, from U.S. Pat. No. 6,046,792, incorporated herein by reference.

In a manufacturing process using a lithographic apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer.

If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book *"Microchip Fabrication: A Practical Guide to Semiconductor Processing"*, Third Edition, by Peter van Zant, McGraw Hill Publishing Co., 1997, ISBN 0-07-067250-4, incorporated herein by reference.

In a manufacturing process using a lithographic apparatus, the pattern has to be imaged on the substrate very accurately. Current lithographic apparatuses are commonly used to manufacture devices with typical dimensions in the micron or submicron range. Hence, the pattern has to be imaged on the substrate with a corresponding accuracy. Disturbances, such as mechanical vibrations or air pressure waves, can alter the position of the pattern with respect to the substrate and thereby affect the process. The disturbances may be caused, for example, by floor vibrations, reaction forces of a positioning device of the substrate holder, reaction forces of a further positioning device by means of which the mask holder is displaceable relative to a focusing unit or otherwise. Hence, the lithographic apparatus has to be configured such that disturbances are suppressed or circumvented.

As disclosed in International Patent Application WO-A-96/38766 and U.S. Pat. No. 6,226,075, lithographic apparatuses that are supported by a base via three supporting devices are known. Such supporting devices prevent, inter alia, the transmission of vibrations from the base to the frame. The three supporting devices each have a gas spring positioned between a first part, which is connected to the base,, and a second part, which is connected to the frame. The mass-spring system formed by the known supporting devices and the frame together with the components of the lithographic apparatus supported thereby has a low natural frequency to prevent transmission of vibrations from the base to the frame as much as possible.

SUMMARY OF THE INVENTION

A problem of these prior art supporting devices is that the gas spring leaks gas and, therefore, gas has to be supplied during operation in order to maintain an average gas pressure. During the supply of gas, pressure fluctuations present in the gas supply are transmitted to the pressure chamber. The pressure fluctuations in the pressure chamber cause mechanical vibrations of the second part of the supporting device, which are transmitted to the frame of the lithographic device. This results in a degraded image quality as a consequence of the vibrations. Of course, the lithographic device may be stopped while gas is being supplied to the pressure chambers of the supporting devices, to prevent such an undesirable adverse effect . But this adversely affects the production output of the lithographic device.

The supporting devices disclosed by U.S. Pat. No. 6,144, 442, incorporate a gas spring system. The gas spring system has gas supply means for maintaining an average gas pressure during operation. The gas supply means is connected to an intermediate space which is in communication with the pressure chamber of the gas spring via a pneumatic restriction. The gas flow from the intermediate space to the pressure chamber will occur in the pneumatic restriction mentioned above when gas is supplied by the gas supply means to the intermediate space. This gas flow encounters a predetermined resistance in the pneumatic restriction. Comparatively high-frequency pressure fluctuations of the gas in the intermediate space are damped by the resistance of the restriction before being transmitted to the pressure chamber. The pneumatic restriction together with the pressure chamber thus forms a so-called pneumatic low-pass filter for the pressure fluctuations occurring in the intermediate space. The pressure fluctuations occurring in the intermediate space are limited by the use of means for controlling the gas pressure present in the intermediate space.

Although the prior art supporting devices reduce, to some extent, vibration-related disturbances in a lithographic apparatus compared to a lithographic apparatus having its frame directly mounted to the base, not all disturbances are suppressed. In particular, the prior art supporting devices suppress disturbances acting on the frame via the base, such as floor vibrations. Thus, disturbances acting directly on the frame—in other words, disturbances not transmitted via the base—are not suppressed. Such disturbances may, for example, be excitations caused by movements of devices, e.g. stages, mounted on the frame. For example in a lithographic projection apparatus of the scanning type, typically a scanning stage moves with a 2 Hz frequency, which may give rise to a 100 micrometer displacement of the frame. Disturbances acting directly on the frame may also be caused by, for example, air pressure variations or otherwise. Typically, air pressure variations may give rise to a disturbance in the frame position in the order of 50 micrometer.

Also, the gas springs in the prior art devices may themselves give rise to disturbances. Such disturbances may for example be caused by pressure variations in the gas springs due to the gas supply. Even in the prior art supporting device known from the U.S. Pat. No. 6,144,442, pressure variations due to the gas supply with a frequency below the cut-off frequency of the pneumatic low-pass filter are not suppressed.

For at least one of the issues identified above, the principles of the present invention, as embodied and broadly described herein, provide for an improved supporting device and, more particular, a supporting device which is less susceptible to disturbances than the known supporting devices. In one embodiment, a supporting device for supporting in a lithographic projection apparatus a supported part relative to a supporting part, the supporting device comprises a first part that engages the supporting part of the lithographic projection apparatus; a second part that engages the supported part of the lithographic projection apparatus; a supporting spring system disposed between the first part and the second part; and a position control system configured to control a position of the supported part. The position control system comprises at least one reference object that is movable relative to the supporting part; a reference support device that supports the reference object relative to the first part, wherein the reference object and the reference support device form a reference mass-spring system; at least one position sensor that detects at least one attribute of the position of the second part relative to at least one of the reference objects, the position sensor including a sensor output for outputting a position signal representing at least one of the attributes; and an actuator, communicatively coupled to the position sensor, that is configured to adjust the position of the second part relative to the first part, in response to the position signal.

The reference object is shielded against disturbances of the first part, such as vibrations of the gas spring, because the reference support device forms a reference mass-spring system together with the reference object. In general, a mass-spring system acts as a filter for vibrations above the natural or resonance frequency of the mass-spring system. Hence, the reference mass-spring system filters disturbances acting on the reference object via the first part. Furthermore, the reference mass-spring system is mounted on the first part and is thus isolated from the second part. Therefore, the position of the reference object is not affected by disturbances acting directly on the second part, such as moving stages, air pressure waves or otherwise. Thus, perturbation of the position of the reference object is prevented and the reference object therefore provides an inertial reference point.

The position sensor senses a property of the position of the second part with respect to this inertial reference point and provides a position signal which represents a property of the position. The actuator adjusts the position of the second part in response to the position signal. Hence, the actuator acts in response to a sensed property of the position relative to an inertial reference point. Therefore, the second part can be accurately positioned and disturbances acting directly on the second part suppressed.

In another embodiment, a lithographic apparatus is presented, which comprises a substrate holder configured to hold a substrate; a projection system configured to project a patterned beam onto a target portion of the substrate; a support structure configured to support at least the projection system; and a base that supports the support structure via a supporting device. The supporting device comprises a first part that engages the base; a second part that engages the support structure; a supporting spring system disposed between the first part and the second part; and a position control system configured to control a position of the support structure. The position control system comprises at least one reference object that is movable relative to the base; a reference support device that supports the reference object relative to the first part, wherein the reference object and the reference support device form a reference mass-spring system; at least one position sensor that detects at least one attribute of the position of the second part relative to the at least one of the reference objects, the position sensor including a sensor output for outputting a position signal representing at least one of the attributes; and an actuator, communicatively coupled to the position sensor, that is configured to adjust the position of the second part relative to the first part, in response to the position signal.

In another embodiment, a device manufacturing method is presented, which comprises providing a substrate that is at least partially covered by a layer of radiation-sensitive material; providing a support structure that is configured to support at least a projection system; providing a base that supports the support structure via a supporting device; conditioning a beam of radiation using a radiation system; configuring the beam of radiation with a desired pattern in its cross-section; and projecting a patterned beam of radiation onto a target area of the layer of radiation-sensitive material via the projection system. The supporting device comprises first part that engages the base; a second part that engages the support structure; a supporting spring system disposed between the first part and the second part; and a position control system configured to control a position of the support structure. The position control system comprises at least one reference object that is movable relative to the base; a reference support device that supports the reference object relative to the first part, wherein the reference object and the reference support device form a reference mass-spring system; at least one position sensor that detects at least one attribute of the position of the second part relative to the at least one of the reference objects, the position sensor including a sensor output for outputting a position signal representing at least one of the attributes; and an actuator, communicatively coupled to the position sensor, that is configured to adjust the position of the second part relative to the first part, in response to the position signal.

Such a lithographic apparatus and device manufacturing method have an improved accuracy of positioning the patterning device.

BRIEF DESCRIPTION OF DRAWINGS

Embodiments of the invention will now be described, by way of example only, with reference to the accompanying schematic drawings in which.

DETAILED DESCRIPTION OF THE INVENTION

Figure 1:
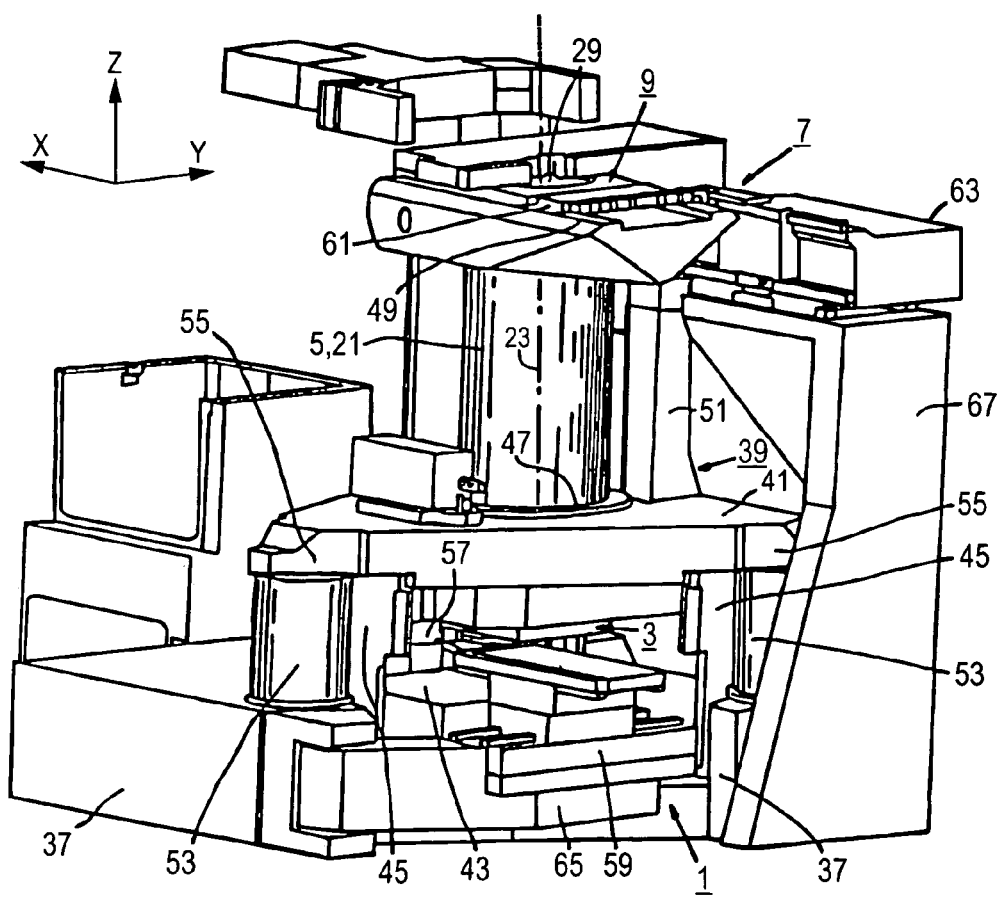
FIG. 1 shows a perspective view of an example of a lithographic projection apparatus.
Figure 2:
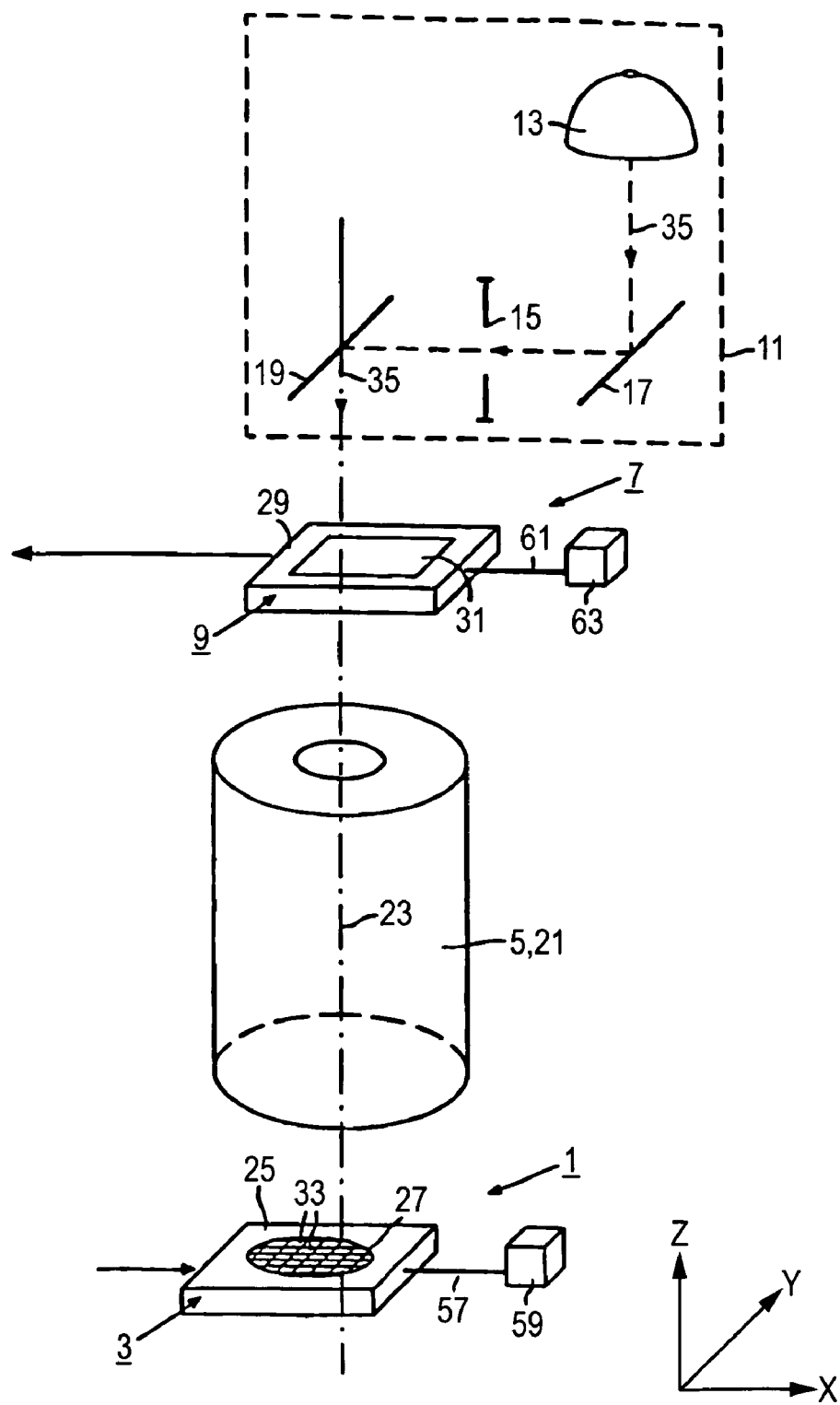
FIG. 2 diagrammatically depicts the lithographic projection apparatus of FIG. 1.

The example of a lithographic apparatus shown in FIGS. 1 and 2 is suitable for use in the manufacture of integrated semiconductor circuits by a lithographic process. As FIGS. 1, 2 show, the lithographic apparatus, seen from the ground along a vertical direction Z, is provided with, in that order, a positioning device 1 that includes a substrate holder 3 and a focusing unit 5, a further positioning device 7 that includes a mask holder 9, and a radiation source 11 (see FIG. 2).

The lithographic apparatus is an optical lithographic projection apparatus in which the radiation source 11 comprises a light source 13, a diaphragm 15, and mirrors 17 and 19. The focusing unit 5 is an imaging or projection system provided with an optical lens system 21, having an optical main axis 23 directed parallel to the Z-direction and an optical reduction factor which, for example, may be 4 or 5. However, the lithographic apparatus may likewise be of a different type comprising a different radiation source, such as for example a Deep Ultra Violet (DUV) or Extreme Ultraviolet (EUV) radiation source, an electron beam source or other suitable sources.

The substrate holder 3, which may also be referred to as the substrate table, comprises a support surface 25 that extends perpendicular to the Z-direction and on which a semiconductor substrate 27 can be placed. The support surface 25 is displaceable relative to the focusing unit 5 in a plane defined by an X-direction and Y-direction of which both are perpendicular to each other and to the Z-direction, by means of the positioning device 1.

The mask holder 9 comprises a support surface 29 that extends perpendicular to the Z-direction and on which a mask 31 can be placed. Mask holder 9 is displaceable relative to the focusing unit 5 parallel to the X-direction by means of the further positioning device 7.

The semiconductor substrate 27 comprises a large number of fields 33 on which identical semiconductor circuits may be provided, while the mask 31 comprises a pattern or a sub-pattern of a single integrated semiconductor circuit. During operation, the individual fields 33 of the semiconductor substrate 27 are consecutively exposed through the mask 31. A light beam 35 originating from the light source 13 is guided through the mask 31 via the diaphragm 15 and the mirrors 17, 19 during an exposure step and is focused on an individual field 33 of the semiconductor substrate 27 by the focusing unit 5, so that the pattern present on the mask 31 is imaged on a reduced scale on said field 33 of the semiconductor substrate 27.

An imaging method following the so-called "step and scan" principle is used in the shown lithographic apparatus. In this imaging method, the semiconductor substrate 27 and the mask 31 are synchronously displaced relative to the focusing unit 5 parallel to the X-direction by means of the positioning device 1 and the further positioning device 7, respectively, during an exposure step. After an exposure of an individual field 33 a next field 33 of the semiconductor substrate 27 is brought into position relative to the focusing unit 5 in that the substrate holder 3 is displaced stepwise parallel to the X-direction and/or parallel to the Y-direction by means of the positioning device 1.

The pattern present on the mask 31 is thus scanned parallel to the X-direction and imaged on the consecutive fields 33 of the semiconductor substrate 27. This process is repeated a number of times, each time with a different mask comprising a different pattern or sub-pattern, so that integrated semiconductor circuits with complicated layered structures can be manufactured.

Such structures have detail dimensions which lie in the submicron range. Therefore, the patterns of sub-patterns present on the masks should be imaged on the semiconductor substrates with an accuracy which also lies in the submicron range, so that very high requirements are imposed on the accuracy with which the substrate holder and the mask holder can be positioned relative to the focusing unit by means of the positioning device and the further positioning device, respectively.

As FIG. 1 illustrates, the lithographic apparatus comprises a base 37, which can be placed on a horizontal floor. The lithographic apparatus also comprises a frame 39, which may also be referred to as a support structure, which supports the substrate holder 3, the focusing unit 5, and the mask holder 9 in a vertical support direction and which extends parallel to the Z-direction. The frame 39 is provided with a triangular, comparatively stiff metal main plate 41 that extends transversely to the optical main axis 23 of the focusing unit 5 and which is provided with a central light transmission opening which is not visible in FIG. 1.

The base 37 supports the frame 39 in the vertical support direction by means of three supporting devices 53, which are mutually arranged in a triangle and which each exert a supporting force on the main plate 41 of the frame 39 directed parallel to the support direction. The main plate 41 for this purpose has three corner portions 55 by means of which the main plate 41 rests on the three supporting devices 53. It will be appreciated that only two of the three corner portions 55 of the main plate 41 and two of the three supporting devices 53 are visible in FIG. 1.

The substrate holder 3 is displaceably guided over a carrier 43 of the frame 39, which extends perpendicular to the Z-direction and which is suspended from a lower side of the main plate 41 by means of three vertical suspension plates 45. It is noted that only two of the three suspension plates 45 are partly visible in FIG. 1. The focusing unit 5 is fastened to the main plate 41 by means of a mounting ring 47 which is fastened to the focusing unit 5 at a lower part of the focusing unit 5.

The mask holder 9 is displaceably guided over a further carrier 49 of the frame 39 which extends parallel to the X-direction. The further carrier 49 is fastened to a vertical, comparatively stiff metal column 51 of the frame 39 which is fastened on the main plate 41.

As FIGS. 1 and 2 show, the positioning device 1 comprises a first part 57 and a second part 59, while the further positioning device 7 comprises a first part 61 and a second part 63. The first parts 57 and 61 are fastened to the substrate holder 3 and to the mask holder 9, respectively, while the second parts 59 and 63 are fastened to the base 37. The second parts 59 and 63 exert driving forces on the respective first parts 57 and 61 during operation, whereupon the first parts 57 and 61 exert reaction forces on the respective second parts 59 and 63.

As shown in FIG. 1, the second part 59 of the positioning device 1 is fastened to a comparatively stiff metal arm 65, which is in turn fastened to the base 37, and the second part 63 of the positioning device 7 is fastened to a further comparatively stiff metal column 67, which is also fastened to the base 37.

The reaction forces of the positioning device 1 and the further positioning device 7 are, thus, transmitted to the base 37, which may result in reaction forces vibrations in the base 37. Since the base 37 is placed on a floor, vibrations may also occur in the base 37, such as, for example, from the vibrations present in the floor.

Because very stringent requirements are imposed on the accuracy with which the substrate holder 3 and the mask holder 9 can be positioned relative to the focusing unit 5 by the positioning device 1 and the further positioning device 7, respectively, the transmission of vibrations from the base 37 to the frame 39 is undesirable. In particular, the frame 39 supports the substrate holder 3, the mask holder 9, and the focusing unit 5 parallel to the vertical support direction, so that movements of the frame due to vibration may cause a loss in accuracy of positioning the parts of the lithographic projection apparatus relative to each other. In order to prevent a transmission of vibrations present in the base 37 through the supporting devices 53 into the frame 39 during operation, the supporting devices 53 are provided with a system, to be described in more detail further below, that prevents the transmission of vibrations from the base 37 into the frame 39.

Figure 3:
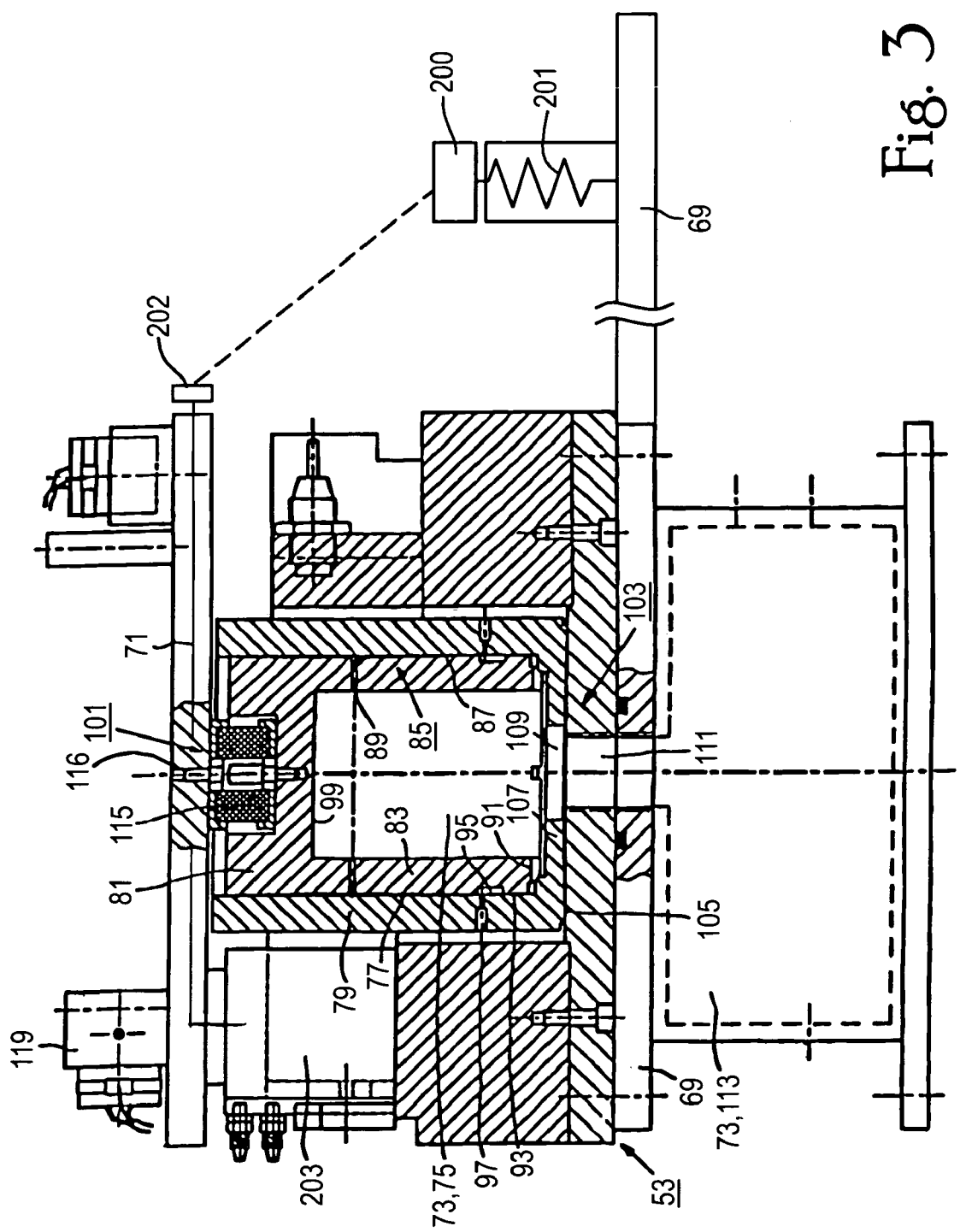
FIG. 3 shows a diagrammatic cross-sectional view of an example of a supporting device in accordance with an embodiment of the present invention.

As depicted in FIG. 3, the supporting device 53 used in the example of a lithographic apparatus of FIG. 1 comprises a first part 69, which can be fastened to the base 37 of the lithographic projection apparatus, a second part 71, which can be fastened to the frame 39 of the lithographic projection apparatus, and a gas spring 73 for supporting the second part 71 relative to the first part 69 by means of a supporting force which is directed parallel to the vertical support direction. As will be described below in greater detail, the supporting device 53 also comprises a position control system that controls the position of the second part 71, in accordance with an embodiment of the present invention.

The gas spring 73 comprises a pressure chamber 75 in which a comparatively high gas pressure is present during operation. The pressure chamber 75 is bounded by a cylindrical inner wall 77 of a beaker-shaped intermediate part 79 of the supporting device 53 and by a piston 81 which is displaceable in the intermediate part 79 parallel to the support direction.

The piston 81 comprises a sleeve 83 which is supported relative to the intermediate part 79 perpendicular to the support direction via a static gas bearing 85, which is present between the cylindrical inner wall 77 of the intermediate part 79 and a cylindrical outer wall 87 of the sleeve 83.

The static gas bearing 85 may comprise a conical gap bearing, which is usual and known in the art, and is provided with a gas supply line 89, which is provided in the sleeve 83 and is in communication with the pressure chamber 75.

Adjacent to a lower side 91 of the sleeve 83, a sealing gap device 93 is positioned between the inner wall 77 of the intermediate part 79 and the outer wall 87 of the sleeve 83, to prevent a leakage of gas from the pressure chamber 75 along the piston 81. A trapping groove 95 for gas leaking along the sealing gap 93 and gas flowing from the static gas bearing 85 is provided between the sealing gap 93 and the static gas bearing 85 in the outer wall 87 of the sleeve 83.

The trapping groove 95 is in communication with a number of exhaust channels 97 provided in the intermediate part 79 for the removal of the gas present in the trapping groove 95 to the surroundings. The trapping groove 95 and the exhaust channels 97 prevent the operation of the static gas bearing 85 from being influenced by gas which leaks along the sealing gap 93. The supporting force supplied by the supporting device 53 in the vertical support direction is, therefore, a gas pressure force exerted by the gas in the pressure chamber 75 on the annular lower side 91 of the sleeve 83 and on an inner wall 99 of the piston 81 extending transversely to the support direction.

The piston 81 is fastened to the second part 71 via a connection member 101, while the beaker-shaped intermediate part 79 is supported relative to the first part 69 in the vertical support direction via a further static gas bearing 103. The further static gas bearing 103 may also comprise a conical gap bearing and is positioned between a support surface 105 of the first part 69 extending perpendicularly to the vertical support direction and a bottom wall 107 of the intermediate part 79. The bottom wall 107 bounds the pressure chamber 75 and also extends perpendicularly to the vertical support direction. The beaker-shaped intermediate part 79 is guided in a substantially frictionless manner over the support surface 105 of the first part 69 through the use of the further static gas bearing 103 and is, thus, displaceable in a substantially frictionless manner relative to the first part 69 along directions perpendicular to the vertical support direction.

A passage 109 of the gas spring 73 is provided centrally in the bottom wall 107 of the intermediate part 79. The passage 109 is present in line with a further passage 111 of the gas spring 73. The further passage 111 is provided in the support surface 105 of the first part 69 and in communication with a main chamber 113 of the gas spring 73 arranged in the first part 69. The pressure chamber 75 of the gas spring 73 provided in the intermediate part 79 is in communication with the main chamber 113 of the gas spring 73 provided in the first part 69 via the passage 109 and the further passage 111.

As depicted in FIG. 3, the conical bearing gap of the further static gas bearing 103 merges directly into the passage 109 provided in the bottom wall 107 of the intermediate part 79, so that the passage 109 at the same time forms a gas supply line in communication with the pressure chamber 75 for the further static gas bearing 103. Since the passage 109 in the bottom wall 107 of the intermediate part 79 has a dual function, a particularly simple and practical construction of the further static gas bearing 103 and the gas supply used therein is obtained.

The gas springs 73 of the supporting devices used in the lithographic apparatus together with the frame 39 and the components of the lithographic apparatus supported by the frame 39 constitute a mass-spring system in which the frame 39 is displaceable relative to the base 37 in the vertical support direction and perpendicularly to the vertical support direction. Additionally, the frame is rotatable relative to the base 37 about a vertical axis of rotation and is pivotable about two mutually perpendicular pivot axes, which are perpendicular to the vertical support direction.

Displacements of the frame 39 relative to the base 37 along the vertical support direction are possible by virtue of the pistons 81 of the supporting devices 53 are displaceable in the intermediate parts 79 parallel to the support direction, while displacements of the frame 39 relative to the base 37 perpendicular to the support direction are possible in that the intermediate parts 79 of the supporting devices 53 are displaceable relative to the first parts 69 perpendicularly to the support direction.

Rotations of the frame 39 about a vertical axis of rotation directed parallel to the support direction are possible in that the intermediate parts 79 of the supporting devices 53 are rotatable relative to the first parts 69 about an axis of rotation parallel to the support direction through the use of the further static gas bearings 103. Pivoting movements of the frame 39 about the pivot axes which are perpendicular to the support direction are possible in that the pistons 81 of the supporting devices 53 are fastened to the second parts 71 via the connection members 101 mentioned above.

As illustrated in FIG. 3, each of connection members 101 comprise a rubber ring 115, which functions to clamp the pistons to the bottom plate 69 when there is no pressure in the pistons, such as, for example, during the transport of the support system. A pin 116 is present inside the rubber ring 115 so that, in use, i.e. when the gas spring is pressurized, the rubber ring will be compressed, until the pin makes contact with the second part 71 and decouples the rotation of the second part 71 with respect to the gas spring.

To prevent the transmission of vibrations from the base 37 to the frame 39 of the lithographic apparatus, as well as from the first parts 69 to the second parts 71 of the supporting devices 53, the mass-spring system should be designed to have natural frequencies that are as low as possible parallel to the support direction, perpendicular to the support direction, around the axis of rotation which is parallel to the support direction, and about said pivot axes which are perpendicular to the support direction. As such, the supporting devices 53 have a stiffness, which is as low as possible in the support direction, perpendicular to the support direction, around the axis of rotation parallel to the support direction, and around the pivot axes perpendicular to the support direction.

As is known from the laws of physics, the natural frequency of a mass-spring system is proportional to the ratio of the spring constant and the mass. The spring constant is a factor that indicates the amount of force required to displace the ends of a spring 1 meter. Thus, a spring constant, and thus stiffness, which is as low as possible results in a commensurately low natural frequency.

The lowest possible stiffness of the supporting device 53 parallel to the support direction is achieved by virtue of the gas spring 73 having a given volume that is as large as possible. The gas spring 73 provided with the main chamber 113 described above in addition to the pressure chamber 75, in which the main chamber 113 is in communication with the pressure chamber 75. The use of the main chamber 113 makes it possible to reduce the volume of the pressure chamber 75, so that the dimensions and weight of the displaceable intermediate part 79 can remain within suitable limits.

Furthermore, a gas supply channel (not shown in the figures) of the gas spring 73, by means of which constant average gas pressure in the gas spring 73 is maintained, can be connected to the main chamber 113. Since the pressure chamber 75 is bounded by the piston 81, which is displaceably guided in the intermediate part 79 via the static gas bearing 85, the stiffness of the supporting device 53 in the support direction is to a significant degree determined by the stiffness of the gas spring 73. The static gas bearing 85 and the sealing gap 93 exert substantially no frictional forces on the piston 81 as seen in the support direction. Neither is the stiffness of the supporting device 53 in the support direction substantially influenced by the presence of the connection member 101, which is substantially undeformable parallel to the support direction, or by the presence of the further static gas bearing 103, which also has a very high stiffness seen in the support direction.

Since the stiffness of the supporting device 53 parallel to the support direction is substantially entirely determined by the stiffness of the gas spring 73, a suitable design of the pressure chamber 75 and the main chamber 113 will achieve a sufficiently low stiffness of the gas spring 73, so that the transmission of vibrations directed in the support direction from the first part 69 to the second part 71 of the supporting device 53 is prevented as much as possible.

The fact that the intermediate part 79 of the supporting device 53 is displaceable in a substantially frictionless manner over the support surface 105 of the first part 69 via the further static gas bearing 103 implies that the supporting device 53 has a stiffness which is substantially zero in directions perpendicular to the support direction, while the mass-spring system of the lithographic projection apparatus mentioned above has a natural frequency which is also substantially zero perpendicular to the support direction. Transmission of vibrations directed perpendicular to the support direction from the base 37 and the first part 69 to the frame 39 and the second part 71 is substantially fully prevented thereby.

The supporting device 53 has a stiffness which, as noted above, is substantially zero around an axis of rotation extending parallel to the support direction because the intermediate part 79 of the supporting device 53 is substantially frictionless rotatable over the support surface 105 of the first part 69 owing to the use of the further static gas bearing 103, so that the transmission of rotational vibrations of the first part 69 about an axis of rotation extending parallel to the support direction to the second part 71 of the supporting device 53 is also substantially fully prevented.

As discussed above, the second part 71 of the supporting device 53 is displaceable relative to the first part 69 in directions parallel to the support direction and perpendicular to the support direction, is rotatable about an axis of rotation extending in the support direction, and is pivotable about two mutually perpendicular pivot axes which are perpendicular to the support direction. It is noted that the supporting device 53 may be provided with means for preventing or restricting such displacements, rotations, and pivoting movements. For example, a system of motion dampers may be provided between the first part 69 and the second part 71. Such a system of motion dampers, may for example, be a system of Lorentz force actuators, usual and known per se, between the first part 69 and the second part 71, as is shown in FIG. 3 with reference numeral 203.

The supporting devices 53 in the lithographic apparatus of FIGS. 1–2 may each be provided, for example, with one or more Lorentz force actuators, in which case the Lorentz force actuators of the supporting devices 53 in combination serve to prevent or restrict said displacements, rotations, and pivoting movements of the frame 39 relative to the base 37. In FIG. 3, reference numeral 119 denotes an vibration or motion sensor which is to cooperate with the Lorentz force actuators 203 for measuring vibrations of the second part 71.

FIG. 3 additionally illustrates a position control system comprising a reference object 200, which is movable with respect to the first part 69 and supported by the first part 69 via a reference support structure 201. The position control system also has a position sensor 202, which is mounted on the second part 71. The position sensor 202 can detect properties or attributes of the position of the reference object 200 relative to the position sensor 202 (and thus relative to the second part 71). The attributes of the position may, for example, include the distance between the reference object 200 and the position sensor 202 or changes, such as, the velocity or acceleration therein. The position sensor outputs a position signal, which represents one or more of the detected attributes of the position, such as a change in distance between the reference object 200 and the position sensor 202.

The position sensor 202 is communicatively coupled to an actuator 203. The actuator 203 can adjust the position of the second part 71 relative to the first part 69 of the supporting device 53 in response to a position signal provided by the position sensor 202. Thus, the position control system controls the position of the second part 71 relative to the reference object 200. In the illustrated embodiment, the actuator 203 comprises, although not limited to, a system of Lorentz force actuators, between the first part 69 and the second part 71. Lorentz force actuators do not transmit any vibrations from the first part 69 to the second part 71 since Lorentz force actuators are contactless.

In the embodiment of FIG. 3, the reference support structure 201 comprises a reference spring on which the reference object is suspended. The reference object 200 and the reference support 201 together form a reference mass-spring system. The reference support structure 201 is mounted between the first part 69 and the reference object 200. The reference mass-spring system has a certain stiffness and mass and, therefore, a certain natural frequency (and like all mass-spring systems, a certain inherent damping; however, a separate damper may also be provided to the reference mass-spring system).

Disturbing vibrations acting on the first part 69 with a frequency above the natural frequency of the reference mass-spring system are suppressed by the reference mass-spring system. The reference object is, therefore, shielded from disturbances acting on the first part 69, such as, for example, vibrations in the floor on which the first part 69 is mounted or reaction forces, as explained above with reference to the base of the lithographic apparatus of FIGS. 1 and 2. Moreover, the reference mass-spring system is positioned on the first part. Disturbances acting directly on the second part, such as air pressure changes or acoustics, do not affect the position of the reference object 200. Thus, control of the position of the second part 71 relative to the reference object 200 results in an increased accuracy of the position of the second part 71.

In the embodiment of FIG. 3, the accuracy of the position control of the second part 71 by the position control system is further improved because the reference spring system is a separate spring system and not a part of the gas spring 73. Because the reference spring system is separate from the gas spring 73, the position of the reference object 200 is not influenced by disturbances caused by the gas spring 73 of the supporting device 53, such as pressure variations due to the supply of gas to the gas spring 73.

The accuracy of the positioning of the second part can be further improved by making the resonance frequency of the reference mass-spring system lower than natural frequency of the support system (which typically is 0.5 Hz), because the reference mass is constant and may be relatively low (such as 1 kg or less if so desired) whereas the resonance frequency of the support system is typically 0.5 Hz, and may be difficult to make lower due to the high load on the support system. Thus, the position of the reference object can be shielded more accurately with respect to disturbances acting via the base than the position of the supported part.

Preferably, the natural frequency of the reference mass-spring system and the gas spring system 73 are as low as possible, e.g. almost zero. The natural frequencies of both spring systems may be similar or different. A suitable value for the natural frequency of the reference mass-spring system, which suppresses most of the occurring disturbances and which can for example be used in the known lithographic apparatuses manufactured by the assignee is between 0.3 and 0.6 Hz, e.g., 0.5 Hz. Suitable values of the mass and spring stiffness in a 0.5 Hz system are 1 kg and 10 N/m. However, a higher or lower mass and/or spring stiffness may likewise be used, depending on the specific implementation.

In the art, lithographic apparatuses are known which comprise a control loop with a vibration or motion sensor which senses the position (or changes therein) of the second part 71 relative to the first part 69 and operates an actuator, such as the Lorentz force actuator in FIG. 3, in response to the measured position or change. However, in these prior art apparatuses, the actuator may only actuate with a frequency at or below the natural frequency of the support system. If the actuator frequency exceeds the natural frequency of the support system, the vibration isolation of the support system may deteriorate as the disturbances filtered by the support system are still transferred from the first part 69 to the second part 71 via the control loop.

In the embodiment of FIG. 3, the position of the second part relative to the reference object is measured. As such, the bandwidth of the position control system, in other words, the actuator frequency relative to the reference object, may be much higher than the natural frequency of the support mass-spring system (e.g., up to 20 Hz or higher) without affecting the vibration isolation of the support system. Thereby, the position control system can also correct for disturbances above the natural frequency of the support system, such as, for example, 2 Hz stage movements. However, a control system in which the position of the second part 71 is measured relative to the first part 69, such as the known control loops, may also be provided, as is shown in the example of FIG. 3 with the vibration or motion sensor 119.

In the embodiment of FIG. 3, the reference support structure 201 comprises a spring of a different type than the gas spring in the support device. That is, reference support structure 201 comprises a non-gas spring, such as, for example, a mechanical spring, an electrostatic spring, a magnetic spring or any other suitable spring mechanism. Hence, the position of the reference object is not subject to the type of disturbances caused by a gas spring system, such as vibrations due to a gas supply and the position of the reference object is more stable. However, the reference support device may likewise comprise a spring of a similar type as the support mass-spring system, e.g. a gas spring.

Figure 4:
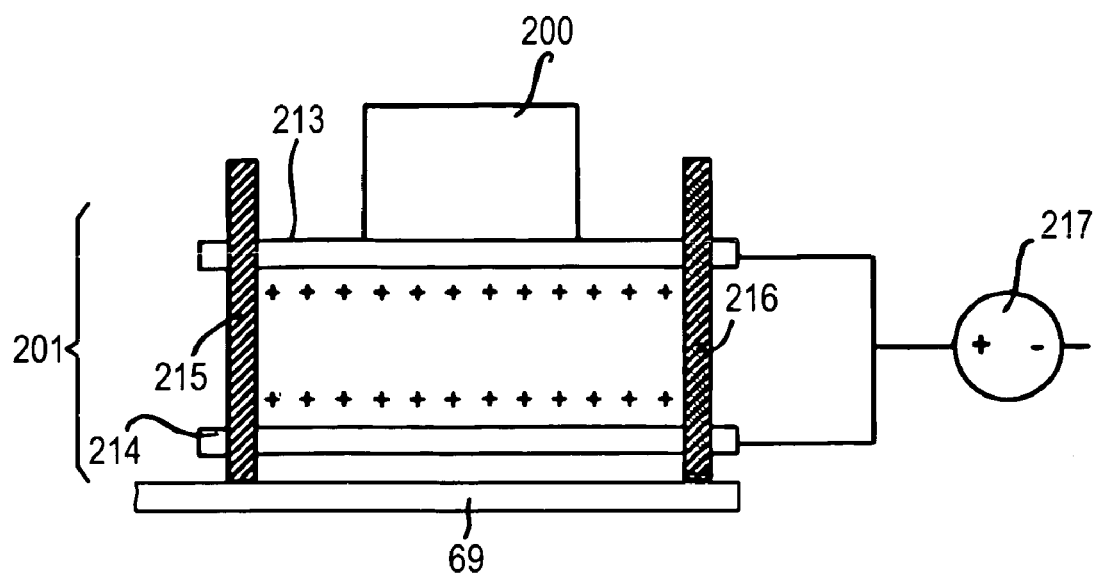
FIGS. 4–9b illustrate examples of reference mass-spring systems suitable for use, in accordance with embodiments of the present invention.

In FIGS. 4–9b, examples of reference mass-springs systems are shown suitable for use in the position control system of the example of FIG. 3. However, other types of mass-spring systems may likewise be used and the invention is not limited to a specific mass-spring system. The example of FIG. 4 depicts an electrostatic spring system. The electrostatic spring system has electrostatic chargeable members 213,214. The electrostatic chargeable members 213,214 each have a plate-shaped chargeable surface and are positioned parallel to each other with the chargeable surfaces facing each other. A first electrostatic chargeable member 214 is positioned near the first part 69 and a second electrostatic chargeable member 213 is positioned at a distance from the first electrostatic chargeable member 214 and the first part 69. The first chargeable member 214 is fixated in position. The second electrostatic chargeable member 213 is movable along guiding means 215,216 with respect to the first electrostatic chargeable member in a transverse direction with respect to the chargeable surface. In the present example, the guiding means 215,216 are elongated poles placed in an upright position on the first part 69 of a supporting device according to the invention. The elongated poles extend through holes in the electrostatic chargeable members 213,214.

The chargeable surfaces of the electrostatic chargeable members 213,214 are chargeable with an electrostatic charge of similar sign by means of a voltage source 217 connected with its positive output contact to the electrostatic chargeable members 213,214. The chargeable surfaces of electrostatic chargeable members 213,214 are charged with a positive electrostatic charge, however the chargeable surfaces may likewise be charged with a negative electrostatic charge. Because of the electrostatic charge, a repulsive force is exerted on each the electrostatic chargeable members 213,214. The repulsive force is proportional to the distance between the electrostatic chargeable members 213,214 and hence the plates act as a spring with a stiffness which is dependent on the electrostatic charge at the electrostatic chargeable members 213,214. The stiffness of the electrostatic spring system is adjustable via the charge on the chargeable plates provided the source 217. A reference object 200 is positioned at a side of the second chargeable plate 213 facing away from the second chargeable plate 214. Thus, a gravitational force caused by the mass of the reference object 200 acts on the second electrostatic chargeable member 213 in a direction opposite to the electrostatic force. The electrostatic chargeable members 213,214 and the reference object together form an electrostatic mass-spring system.

Figure 5:
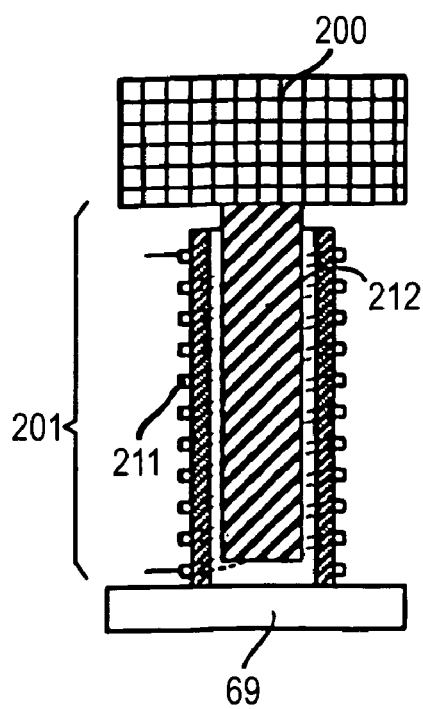

FIG. 5 depicts a reference object 200 supported by a reference support 201 that comprises a magnetic spring system. The magnetic spring system has an air core coil 211 placed in an upright position on the first part 69. The air core of the air core coil 211 forms a passage with an opening at the top of the air core coil 211. A magnet 212 is positioned within the air core coil 211. The magnet 212 extends partially through the opening outside the passage. A reference object 200 is positioned on top of the magnet 212. The air core coil 211 is connected to a, not shown, current source which provides a current flowing through the coil such that in the space enclosed by the coil, e.g. in the air core of the coil, a magnetic field exists which exerts a magnetic force on the magnet 202 in a direction from the first part 69 towards the opening, i.e. in a direction opposite to the gravitational force exerted on the magnet 212 by the reference object 200. The magnetic spring has a stiffness which can be adjusted by changing the magnetic field inside the air core coil, i.e. by adjusting the current flowing through the coil.

Figure 6:
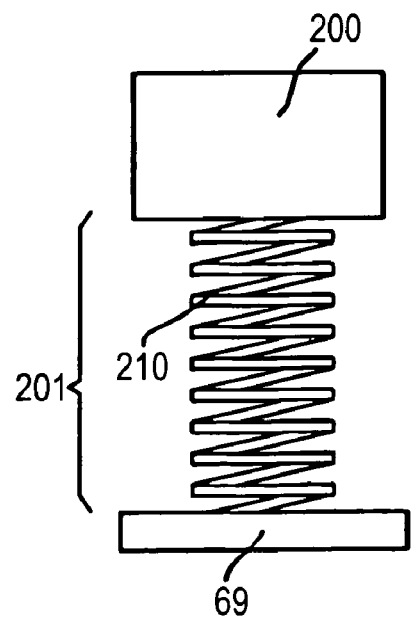

FIG. 6 illustrates a reference object 200 supported by a reference support 201 that comprises a mechanical spring 210. The mechanical spring 210 is placed in an upright position on the first part 69. The reference object 200 lies on top of the mechanical spring 210. In the examples of FIGS. 4–6, the reference object 200 is supported by a single spring in a vertical direction with respect to the second part. However it is likewise possible to use a reference support structure which supports the reference object 200 in other directions as well.

Figure 7:
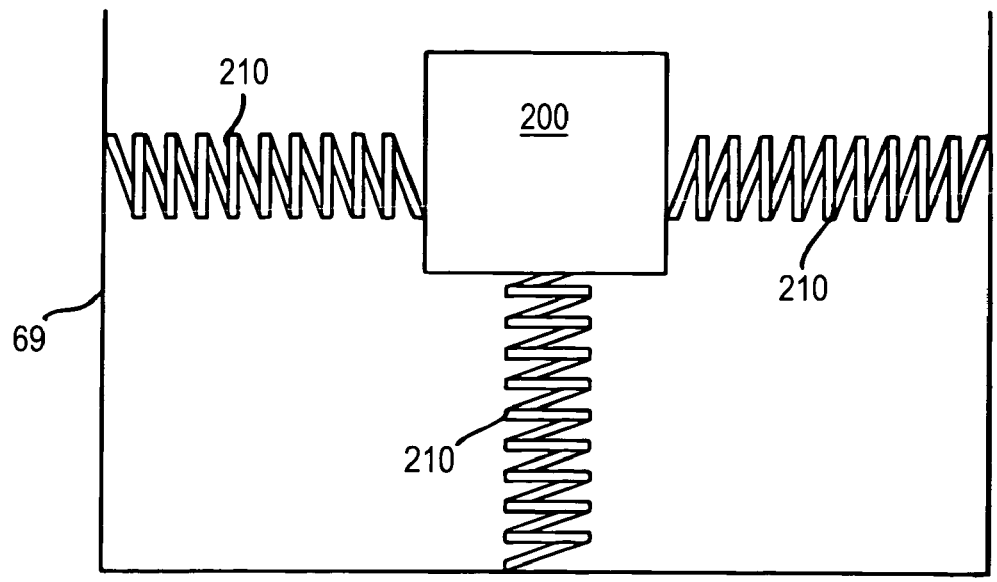

FIG. 7 depicts a number of mechanical springs 210 that support the reference object 200. One of the springs 210 supports the reference object 200 in a vertical direction, while the two other springs support the reference object in horizontal directions. As such, the reference object is not only shielded with respect to vertical vibrations above the natural frequency of the vertical spring, but vibrations in a horizontal direction are suppressed too. In this example, only mechanical springs are used in the reference mass-spring system, however a combination of spring types may likewise be used, such as for example an electrostatic spring supporting the reference object in a vertical direction and mechanical springs supporting the reference object in horizontal directions or otherwise.

Figure 8:
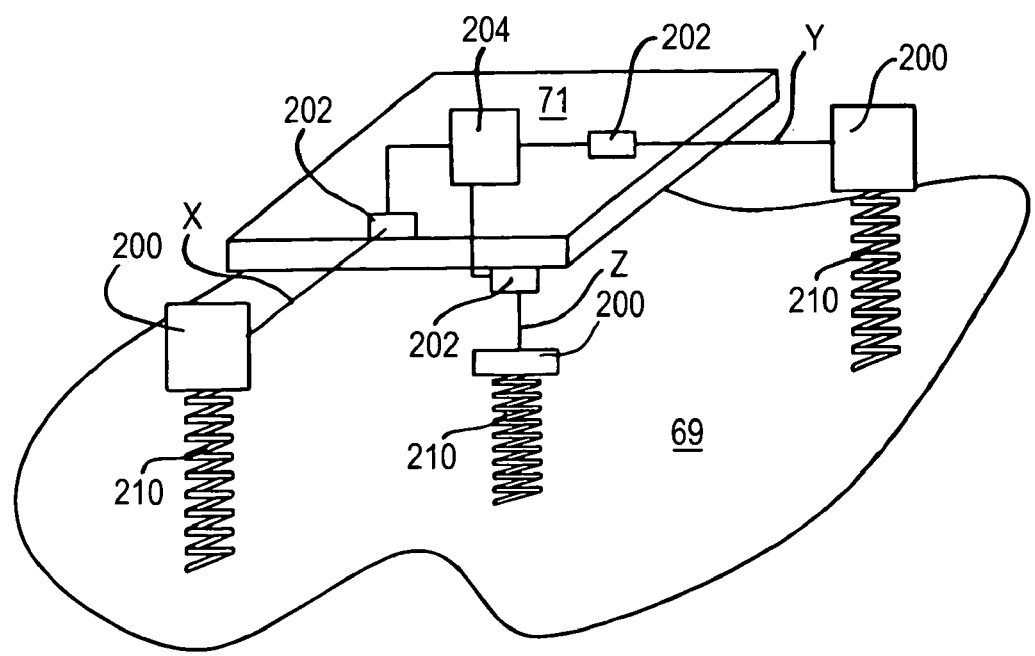

In the embodiment of FIG. 3, the position control system has a single position sensor 202 which measures the distance between the reference object 200 and the position sensor 202. In an alternative embodiment, more than one position sensor, e.g. three position sensors 202, may be used. For example, as shown in FIG. 8, three position sensors 202 are placed on a second part 71 and a corresponding number of reference mass-spring systems are provided on a first part 69. The position sensors 202 are connected to a processor 204 which is connected to one or more actuators (which are not shown in FIG. 8) for adjusting the position of the second part.

Each of the position sensors 202 of the embodiment illustrated in FIG. 8, measures the position of the second part 71 with respect to a reference object 200 in one direction, as is indicated with the lines X, Y, and Z. Thus, the position sensor 202 connected via the line Z, measures the position of the second part 71 with respect to the respective reference object 200 in a vertical direction. Similarly, the position sensors 202 connected via with the lines X and Y, measure the position of the second part with respect to the respective reference object in the X or Y direction, respectively. Thus, the position sensors 202 measure the position of the second part in three degrees of freedom. Depending on the specific implementation, the position control system may likewise measure the position of the second part in another number of degrees of freedom. For example, the frame has six degrees of freedom if the frame can be moved translationally in the X, Y and Z direction as well as rotated around the X, Y and Z direction. To provide an accurate control, the position control system may then measure and control the position of the frame in all six degrees of freedom.

In the embodiment of FIG. 8, the position sensors 202 measure the position of the second part 71 in the respective direction and output a position signal which is proportional to a property of the measured position, such as, the absolute value of the distance between the respective reference object 200 and the second part 71, a change in the distance between the respective reference object 200 and the second part 71, or other suitable attributes. The position signals from the position sensors 202 are fed into the processor 204 which derives from the position signals how the actuator 203 has to adjust the position of the second part 71.

In the embodiment shown in FIG. 8, the processor 204 may also be omitted and each of the position sensors 202 may be connected to a separate actuator which can adjust the position of the second part 72 in the respective degree of freedom, e.g. translate or rotate the second part in the X, Y or Z direction only. In such case, each reference mass-spring system, position sensor and actuator combination forms a position control system for a specific degree of freedom.

Figure 9A:
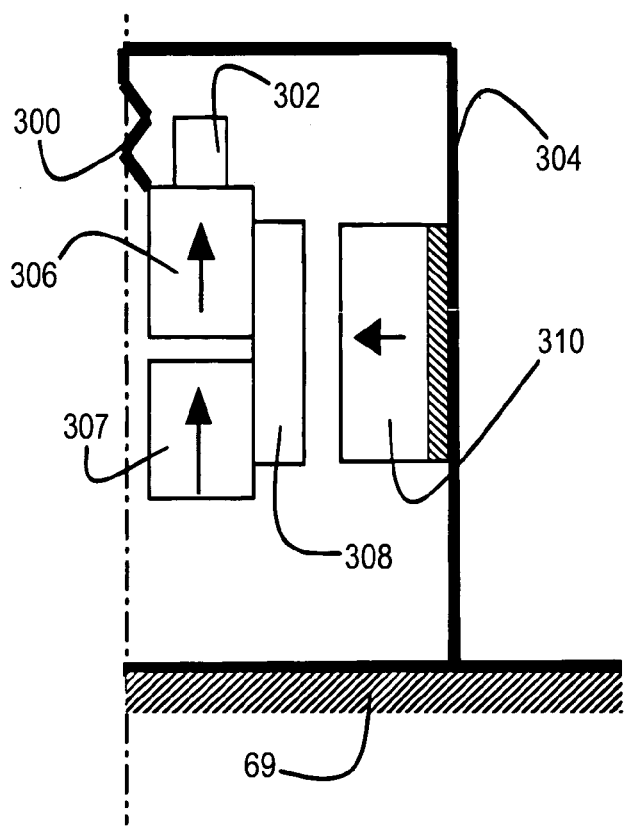

In the embodiment shown in FIG. 9a, the mass spring system comprises a magnet support system and a mechanical spring. The magnetic support system comprises three magnets, two inner cylindrical magnets 306, 307 with their magnetization in vertical direction and a cylindrical outer magnet 310 magnetized in radial direction. The magnetic support system is characterised by a low stiffness in both vertical and horizontal direction. A mass 308 may be added to the inner magnet assembly to compensate for the force generated by the magnetic support system. In this way, the selection or design of a mechanical spring with a low stiffness becomes more easy since the spring has little weight to compensate. The mechanical spring may further serve to maintain the inner magnet assembly in the appropriate horizontal position relative to the outer magnet. The outer magnet may be attached to a small vacuum chamber 304 that is mounted on the second part 69 of the lithographic apparatus. By doing so, the inner magnet assembly is not disturbed by air vibrations.

The inner magnet system is connected to the vacuum chamber by a mechanical spring 300. The combined stiffness of the spring and the magnetic support system provides a mass-spring system with a very low natural frequency (<1 Hz). The inner magnet assembly may further comprise an optical element 302 such as a mirror for measuring the position of the inner magnet system relative to a position sensor mounted on the second part (not shown) of the lithographic device.

Figure 9B:
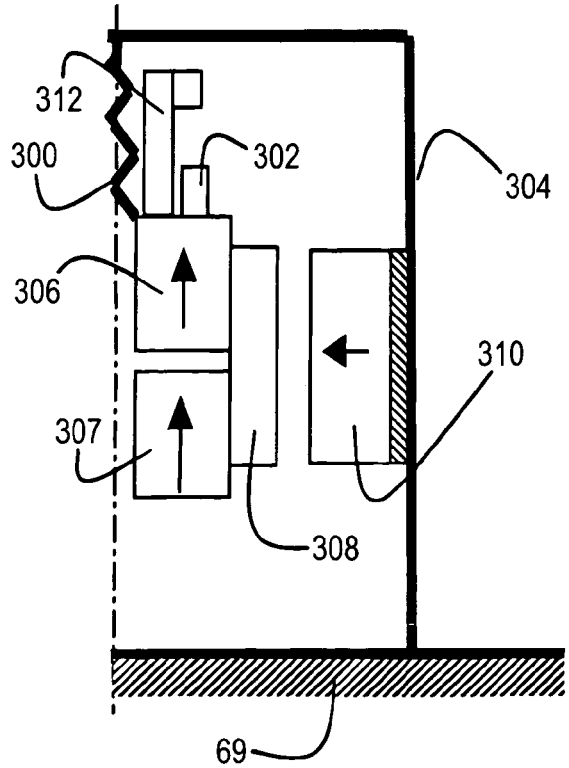

A further reduction of the tilt stiffness of the mass-spring system described in FIG. 9a can be obtained by adding an inverted pendulum to the inner magnet assembly, as shown in FIG. 9b. The negative tilt stiffness of the inverted pendulum 312 can compensate for the positive tilt stiffness of the inner magnet assembly relative to the outer magnet. It will be appreciated by a person skilled in the art that the embodiment as described in FIGS. 9a and 9b may also be applied without the enclosing vacuum chamber. Also, the inner magnet assembly may be mounted on a mechanical spring instead of being suspended from a spring.

While specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein.

For instance, in the example of FIGS. 1–2, the frame 39 supports not only the focusing unit 5 but also the substrate holder 3 and the mask holder 9. However, it is apparent that the substrate holder and the mask holder may likewise be supported by other supporting parts of the lithographic projection apparatus. Furthermore, a supporting device according to the present invention may be used not only in a lithographic projection apparatus but also, for example, in finishing machines, machine tools, and other machines or devices in which the transmission of vibrations to certain components thereof supported by the supporting device is to be prevented or suppressed as much as possible. Furthermore, for example the reference mass-spring system may be positioned in a housing to further shield the reference mass-spring system from disturbances caused, for example, by air pressure waves, e.g. sound or otherwise. Also, the example of FIGS. 1 and 2 is used for an imaging method following the so-called "step and scan" principle. However, the invention is not limited thereto and the invention may likewise be used in, for example, an embodiment of a lithographic projection apparatus using an imaging method following the "step and repeat" principle, wherein the mask and the semiconductor substrate are held in constant positions relative to the focusing unit during the exposure of the semiconductor substrate.

Also, although specific reference may be made in this text to the use of the lithographic projection apparatus in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

Furthermore, the invention is not limited to lithographic projection apparatus using optical radiation, but may likewise be applied for other types of radiation, such as for example electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams or otherwise.

As such, the preceding detailed description is not meant or intended to, in any way, limit the invention—rather the scope of the invention is defined by the appended claims.

What is claimed is:

1. A supporting device for supporting in a lithographic projection apparatus a supported part relative to a supporting part, said supporting device comprising:
   a first part that engages the supporting part of the lithographic projection apparatus;
   a second part that engages the supported part of the lithographic projection apparatus;
   a supporting spring system disposed between the first part and the second part; and
   a position control system configured to control a position of the supported part, said position control system comprising:
   at least one reference object that is movable relative to the supporting part;
   a reference support device that supports the reference object relative to the first part, wherein the reference object and the reference support device form a reference mass-spring system;
   at least one position sensor that detects at least one attribute of the position of the second part relative to at least one of the reference objects, the position sensor including a sensor output for outputting a position signal representing at least one of the attributes; and
   an actuator, communicatively coupled to the position sensor, that is configured to adjust the position of the second part relative to the first part, in response to the position signal.

2. The supporting device of claim 1, wherein the reference mass-spring system is of a different type than the supporting spring system.

3. The supporting device of claim 1, wherein the supporting spring system comprises a gas spring and the reference support device comprises a non-gas spring.

4. The supporting device of claim 1, wherein the at least one position sensor of the position control system comprises at least two position sensors in which each of the at least two position sensors detects at least one attribute of the position of the second part relative to the at least one of the reference objects in a different direction in which the second part is movable relative to the first part.

5. The supporting device of claim 1, wherein the actuator comprises at least one Lorentz force actuator.

6. The supporting device of claim 1, further comprising at least two reference support devices of which at least one first reference support device supports the reference object in a first direction and at least one second reference support device supports the reference object in a second direction wherein the second direction is different from the first direction.

7. The supporting device of claim 1, wherein the reference spring system has a natural frequency which is substantially equal to or lower than a natural frequency of the supporting spring system.

8. The supporting device of claim 1, wherein the position control system can control the position of the second part with a control frequency that is above the natural frequency of the supporting spring system.

9. A lithographic apparatus, comprising:
a substrate holder configured to hold a substrate;
a projection system configured to project a patterned beam onto a target portion of the substrate;
a support structure configured to support the projection system; and
a base that supports the support structure via a supporting device, the supporting device comprising:
  a first part that engages the base;
  a second part that engages the support structure;
  a supporting spring system disposed between the first part and the second part; and
  a position control system configured to control a position of the support structure, said position control system comprising:
    at least one reference object that is movable relative to the base;
    a reference support device that supports the reference object relative to the first part, wherein the reference object and the reference support device form a reference mass-spring system;
    at least one position sensor that detects at least one attribute of the position of the second part relative to the at least one of the reference objects, the position sensor including a sensor output for outputting a position signal representing at least one of the attributes; and
    an actuator, communicatively coupled to the position sensor, that is configured to adjust the position of the second part relative to the first part, in response to the position signal.

10. A device manufacturing method, comprising:
providing a substrate that is at least partially covered by a layer of radiation-sensitive material;
providing a support structure that is configured to support a projection system;
providing a base that supports the support structure via a supporting device; and
projecting a patterned beam of radiation onto a target area of the layer of radiation-sensitive material via the projection system,
wherein the supporting device comprises:
  a first part that engages the base;
  a second part that engages the support structure;
  a supporting spring system disposed between the first part and the second part; and
  a position control system configured to control a position of the support structure, said position control system comprising:
    at least one reference object that is movable relative to the base;
    a reference support device that supports the reference object relative to the first part, wherein the reference object and the reference support device form a reference mass-spring system;
    at least one position sensor that detects at least one attribute of the position of the second part relative to the at least one of the reference objects, the position sensor including a sensor output for outputting a position signal representing at least one of the attributes; and
    an actuator, communicatively coupled to the position sensor, that is configured to adjust the position of the second part relative to the first part, in response to the position signal.

11. A position control system, comprising:
at least one reference object coupled to a supporting part via a reference support device in which the reference object and the reference support device form a reference mass-spring system;
at least one position sensor configured to detect an attribute of a position of a supported part relative to the at least one of the reference objects, the at least one position sensor having a sensor output that provides a position signal, representing the detected attribute of the position; and
an actuator, communicatively coupled to the position sensor, that is configured to adjust the position of the supported part in response to the position signal.

* * * * *